(12) United States Patent
Verma et al.

(10) Patent No.: US 7,370,245 B1
(45) Date of Patent: May 6, 2008

(54) CROSS-CORRELATION OF DELAY LINE CHARACTERISTICS

(75) Inventors: Himanshu J. Verma, Mountain View, CA (US); Ajay Dalvi, San Francisco, CA (US); Paul A. Swartz, Hillsborough, CA (US)

(73) Assignee: XILINX, Inc., San Jose, CA (US)

( * ) Notice: Subject to any disclaimer, the term of this patent is extended or adjusted under 35 U.S.C. 154(b) by 395 days.

(21) Appl. No.: 11/066,685

(22) Filed: Feb. 25, 2005

(51) Int. Cl.
*G06K 5/04* (2006.01)
(52) U.S. Cl. .................................. 714/700
(58) Field of Classification Search ............ 714/725, 714/700; 331/57
See application file for complete search history.

(56) References Cited

U.S. PATENT DOCUMENTS

| 5,914,616 | A | 6/1999 | Young et al. |
| 6,075,418 | A | 6/2000 | Kingsley et al. |
| 6,157,231 | A * | 12/2000 | Wasson ...................... 327/156 |
| 6,204,694 | B1 * | 3/2001 | Sunter et al. ................. 326/93 |
| 7,039,842 | B1 * | 5/2006 | Whitten et al. ............. 714/725 |

OTHER PUBLICATIONS

U.S. Appl. No. 10/683,944, filed Oct. 10, 2003, Young.

* cited by examiner

*Primary Examiner*—James C. Kerveros
(74) *Attorney, Agent, or Firm*—W. Eric Webostad

(57) ABSTRACT

Cross-correlation of delay line characteristics is described. An integrated circuit for cross-correlation testing includes: a first ring oscillator and a second ring oscillator. The first ring oscillator includes a first test circuit, and the second ring oscillator includes a second test circuit. The first test circuit is coupled via first programmable interconnects to first ring oscillator circuitry, and the second test circuit is coupled via second programmable interconnects to second ring oscillator circuitry. The first test circuit includes a first programmable delay line, and the second test circuit includes a second programmable delay line. The first test circuit and the second test circuit are configured to provide separately controllable outputs for cross-correlation as between the first programmable delay line and the second programmable delay line.

20 Claims, 7 Drawing Sheets

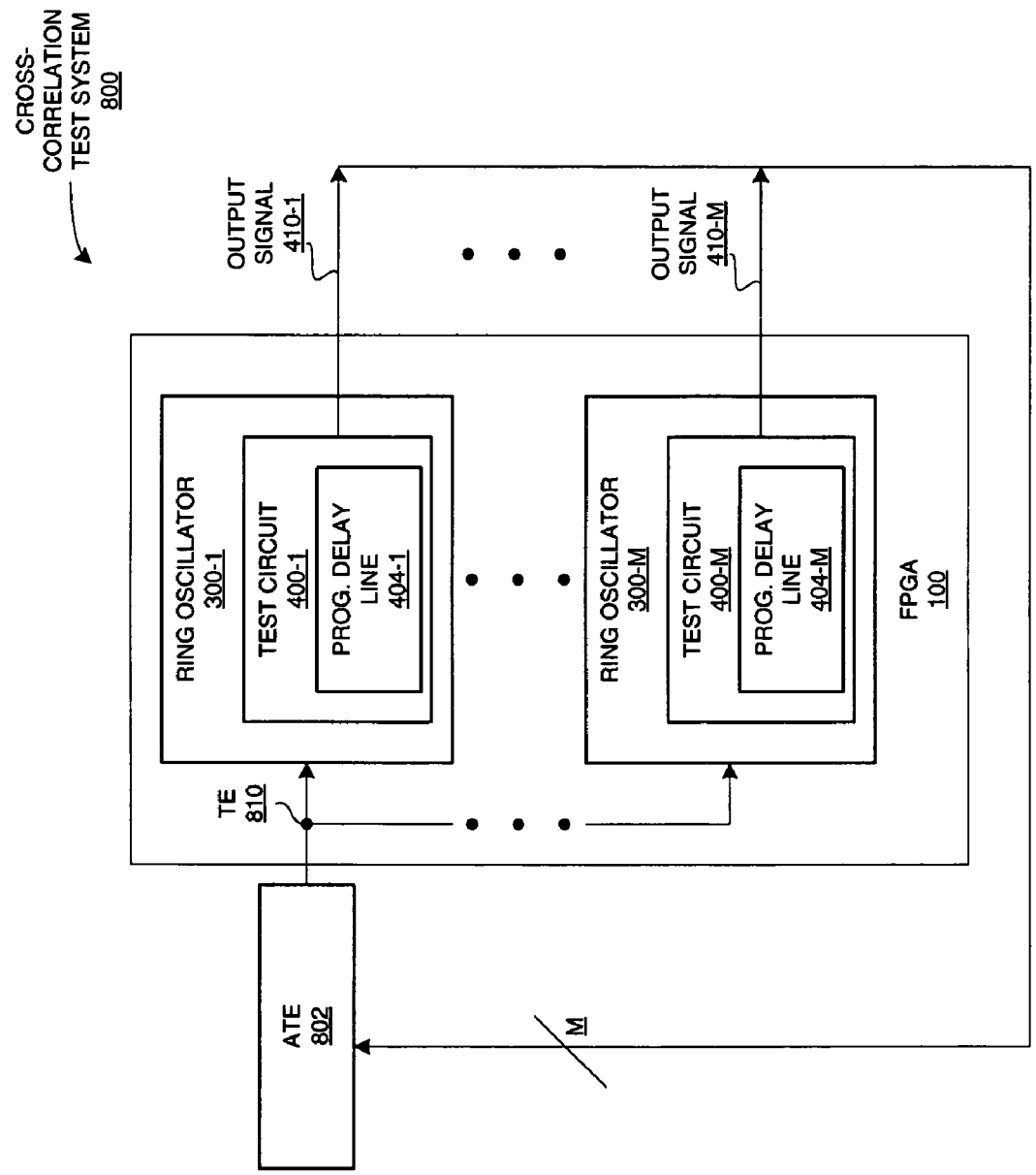

CROSS-CORRELATION OF DELAY LINE CHARACTERISTICS

FIELD OF THE INVENTION

One or more aspects of the invention generally relate to a delay line and, more particularly, to cross-correlation of one or more delay line characteristics.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAM"), multipliers, digital signal processing blocks ("DSPs"), processors, clock managers, delay-lock loops ("DLLs"), and so forth. Notably, as used herein, "include" and "including" mean including without limitation.

One such FPGA, the Xilinx Virtex® FPGA, is described in detail in pages 3-75 through 3-96 of the Xilinx 2000 Data Book entitled "The Programmable Logic Data Book 2000" (hereinafter referred to as "the Xilinx Data Book"), published April, 2000, available from Xilinx, Inc., 2100 Logic Drive, San Jose, Calif. 95124. (Xilinx, Inc., owner of the copyright, has no objection to copying these and other pages referenced herein but otherwise reserves all copyright rights whatsoever.) Young et al. further describe the interconnect structure of the Virtex FPGA in U.S. Pat. No. 5,914,616, issued Jun. 22, 1999 and entitled "FPGA Repeatable Interconnect Structure with Hierarchical Interconnect Lines".

Another such FPGA, the Xilinx Virtex®-II FPGA, is described in detail in pages 33-75 of the "Virtex-II Platform FPGA Handbook", published December, 2000, available from Xilinx, Inc., 2100 Logic Drive, San Jose, Calif. 95124. And yet another such FPGA, the Xilinx Virtex-II Pro™ FPGA, is described in detail in pages 19-71 of the "Virtex-II Pro Platform FPGA Handbook", published Oct. 14, 2002 and available from Xilinx, Inc., 2100 Logic Drive, San Jose, Calif. 95124.

Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices.

Other PLDs are programmed by applying a processing layer, such as a metal layer, that programmably interconnects the various elements on the device. These PLDs are known as mask programmable devices. PLDs can also be implemented in other ways, for example, using fuse or antifuse technology.

The terms "PLD" and "programmable logic device" include these exemplary devices, as well as encompassing devices that are only partially programmable. For purposes of clarity, FPGAs are described below though other types of PLDs may be used. FPGAs may include one or more embedded microprocessors. For example, a microprocessor may be located in an area reserved for it, generally referred to as a "processor block."

In U.S. Pat. No. 6,075,418 B1 ("Kingsley"), a ring oscillator circuit is described. The ring oscillator circuit may be located in an FPGA and used for providing an oscillating test signal. A counter may be coupled to the ring oscillator circuit to determine the period of the ring oscillator circuit. As described in Kingsley, an FPGA may be configured with multiple test circuits, among which may be the ring oscillator circuit. It is further described in Kingsley that components may exhibit different propagation delays depending on whether they are configured to respond to rising or falling clock signal edges. Moreover, it is described in Kingsley that asynchronous test circuits may be included in the ring oscillator circuit, and that these test circuits may represent propagation delays on a test path. These test circuits may be used to characterize various types of propagation delays to produce speed files which predict performance of a design instantiated in an FPGA.

Heretofore, measurement of delay line skew and delay were done using labor intensive test bench measurements. The precision of such test bench measurements was somewhat limited. This limitation made cross-correlation of delay lines even more problematic.

Accordingly, it would be desirable and useful to provide means for cross-correlation of one or more delay line characteristics that overcomes one or more of the limitations associated with use of a test bench.

SUMMARY OF THE INVENTION

One or more aspects of the invention generally relate to a delay line and, more particularly, to cross-correlation of one or more delay line characteristics.

An aspect is an integrated circuit for cross-correlation testing, including: a first ring oscillator and a second ring oscillator. The first ring oscillator includes a first test circuit, and the second ring oscillator includes a second test circuit. The first test circuit is coupled via first programmable interconnects to first ring oscillator circuitry, and the second test circuit is coupled via second programmable interconnects to second ring oscillator circuitry. The first test circuit includes a first programmable delay line, and the second test circuit includes a second programmable delay line. The first test circuit and the second test circuit are configured to provide separately controllable outputs for cross-correlation as between the first programmable delay line and the second programmable delay line.

Another aspect is a method for cross-correlating programmable delay lines. A first rising edge delay for a first setting of each of the programmable delay lines and a second rising edge delay for a second setting of each of the programmable delay lines are measured for determining a rising edge characteristic of each of the programmable delay lines. The rising edge characteristic of each of the programmable delay lines are cross-correlated responsive to at least the second setting.

BRIEF DESCRIPTION OF THE DRAWINGS

FIG. 8 is a block diagram depicting an exemplary embodiment of a cross-correlation test system.

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
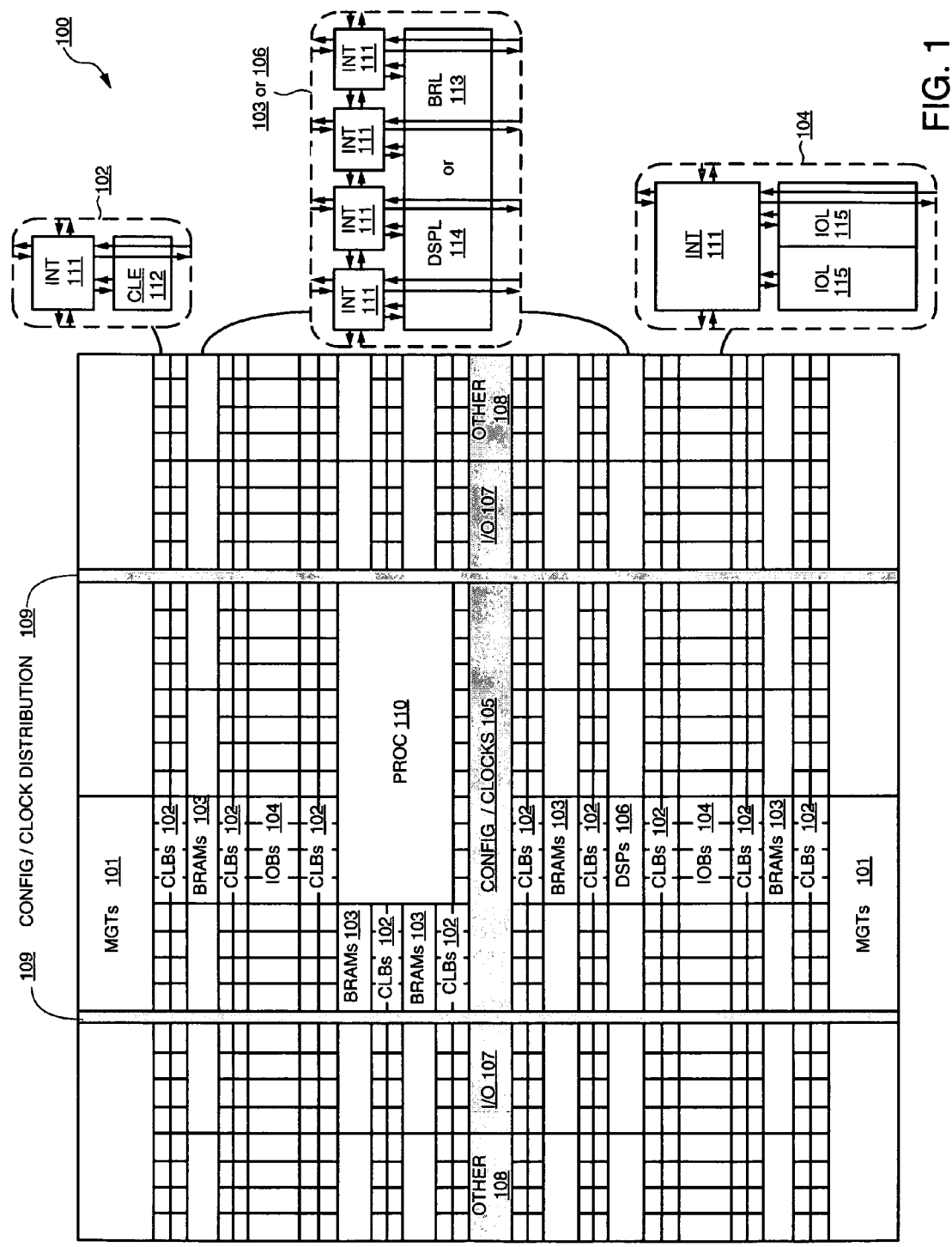
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110. FPGA 100 may be used to implement system 100 of FIG. 1.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. Additional details regarding a columnar architected FPGA may be found in a co-pending patent application, namely, U.S. patent application Ser. No. 10/683,944, entitled "Columnar Architecture" by Steve P. Young, filed Oct. 10, 2003.

FPGA 100 illustratively represents a columnar architecture, though FPGAs of other architectures, such as ring architectures for example, may be used. Moreover, it should be understood that FIG. 1 may be associated with a logic plane of FPGA 100, and that there is another plane, namely a configuration plane, of FPGA 100.

Figure 2:
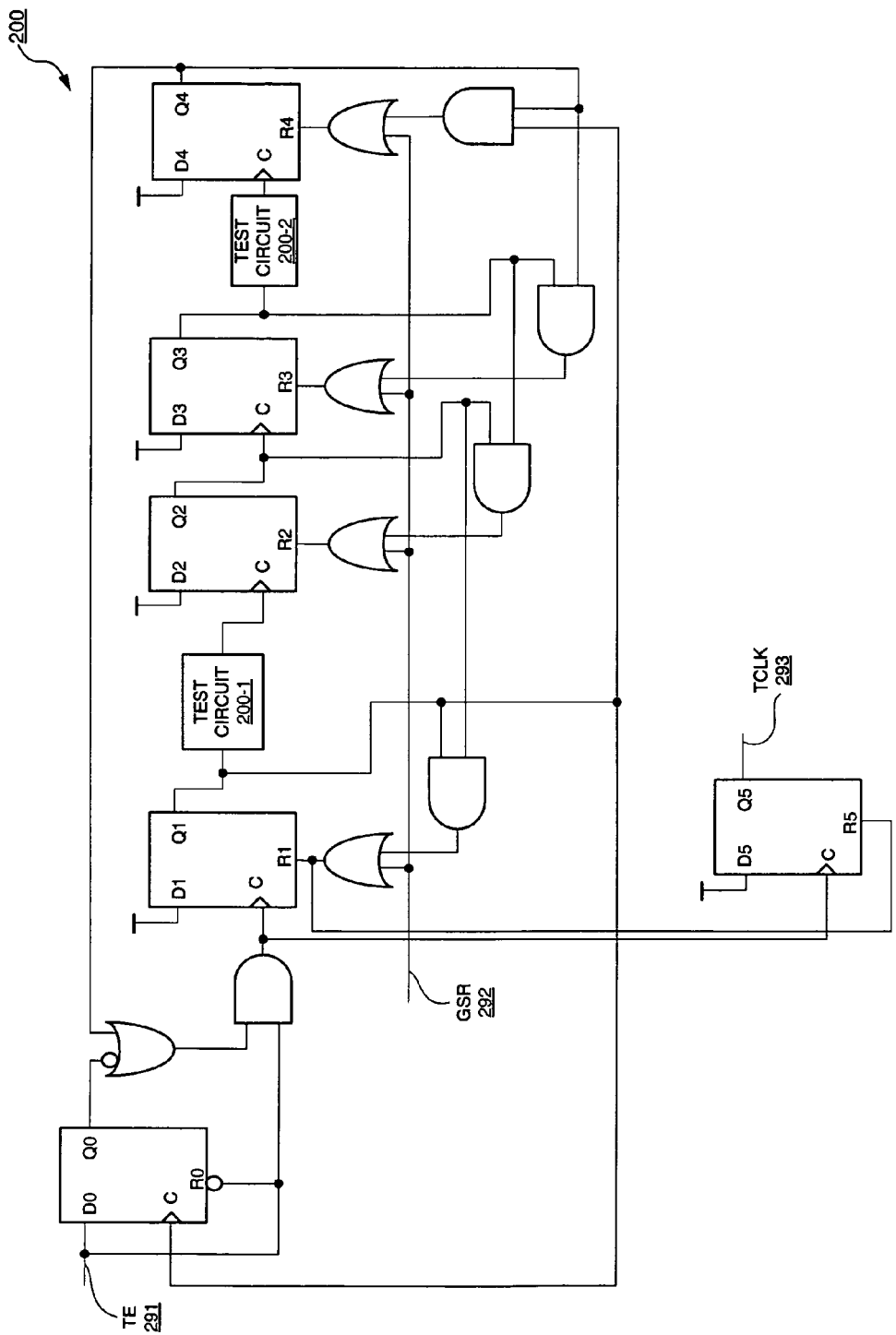
FIG. 2 is a block/schematic diagram depicting an exemplary embodiment of a known ring oscillator including test circuits.

FIG. 2 is a block/schematic diagram depicting an exemplary embodiment of a known ring oscillator 200 having test circuits 200-1 and 200-2. A test activation signal ("TE") 291 and a global set/reset signal 292 may be applied to ring oscillator 200. Ring oscillator 200 may output a test clock signal 293. Additional details regarding ring oscillator 200 may be found in U.S. Pat. No. 6,075,418 B1.

Figure 3:
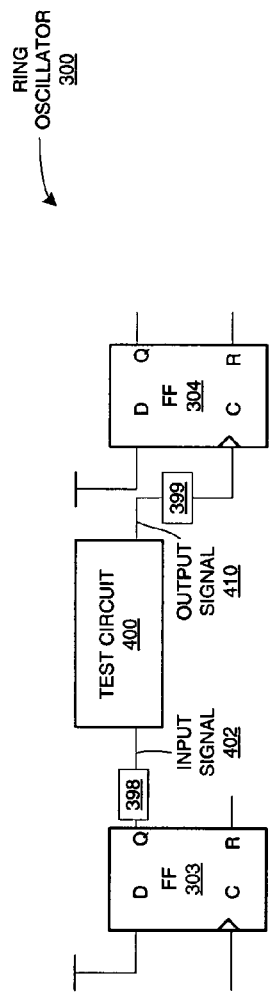
FIG. 3 is a block/schematic diagram depicting an exemplary embodiment of a portion of a ring oscillator having programmably coupled therein a test circuit having programmable delay lines.

FIG. 3 is a block/schematic diagram depicting an exemplary embodiment of a portion of a ring oscillator 300 having a test circuit 400 programmably coupled therein. Ring oscillator 300 portion may be ring oscillator 200 of FIG. 2, except having test circuit 400 programmably coupled therein. Test circuit 400 may be programmably coupled in ring oscillator 300 with programmable interconnects 398 and 399. Programmable interconnect 398 couples an input-side sequential element, such as flip-flop 303, to provide an input signal 402 to test circuit 400. Output of test circuit 400 is output signal 410, which is provided to a clock input of an output-side sequential element, such as flip-flop 304. Test circuit 400 is programmably coupled to flip-flop 304 via programmable interconnect 399. Again, additional details regarding ring oscillator 300 may be found in U.S. Pat. No. 6,075,418 B1. Accordingly, as ring oscillator 300, except for test circuit 400 is known, details regarding operation of such ring oscillator are not provided herein for purposes of clarity.

Figure 4:
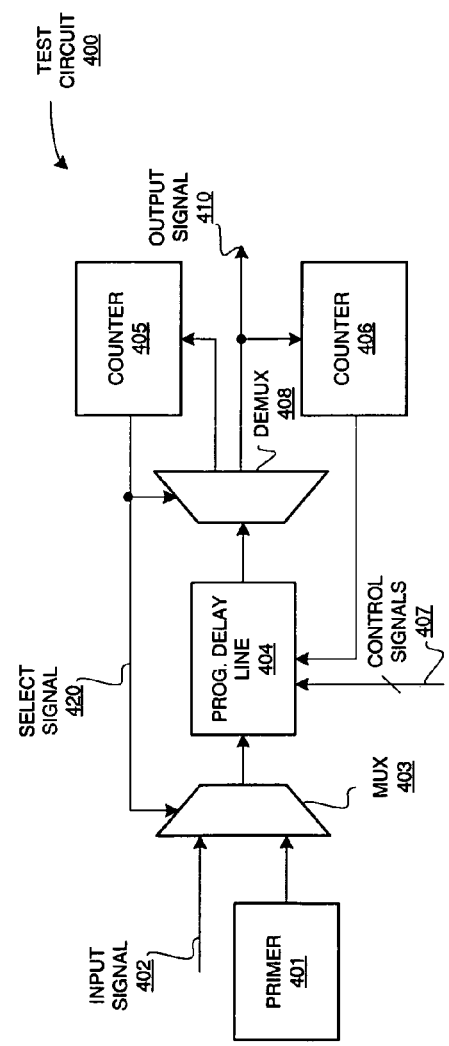
FIG. 4 is a block/schematic diagram depicting an exemplary embodiment of a test circuit that includes a programmable delay line.

FIG. 4 is a block/schematic diagram depicting an exemplary embodiment of test circuit 400. Test circuit 400 includes programmable delay line 404. Programmable delay line 404 is hardwired logic which is configured for an open-loop mode of operation for ring oscillator 300 of FIG. 3.

In an FPGA, such as FPGA 100 of FIG. 1, there are multiple programmable delay lines. For example, a DCM has a programmable delay line, and an IOB has a programmable delay line. Notably, in a DCM, there may be multiple programmable delay lines which may be coupled to one another to extend the length of the programmable delay line of such a DCM. Moreover, IOBs may be chained together to increase the length of their programmable delay lines. Other circuits in an FPGA may have multiple delay lines that may be operated in parallel.

With reference to FIGS. 3 and 4 in combination, ring oscillator 300, which may be instantiated in part in configurable logic, alternatively may be formed of dedicated logic with programmable interconnects, such as programmable interconnects 398 and 399 of FIG. 3, for selectively coupling a test circuit 400 to form ring oscillator 300. In either embodiment, in effect a built-in self-test ring oscillator 300, namely a test circuit internal to an integrated circuit, may be used to measure skew and delay of components of test circuit 400. For example, in an FPGA embodiment, a path under test including a programmable delay line, which programmable delay line is formed from hardwired logic in the FPGA, may be coupled to configurable logic programmed to provide ring oscillator 300 exclusive of test circuit 400. Furthermore, FPGA 100 may be coupled to an integrated circuit ("IC") tester or other automatic test equipment ("ATE") for characterization of test circuit 400 within ring oscillator 300.

Figure 5:
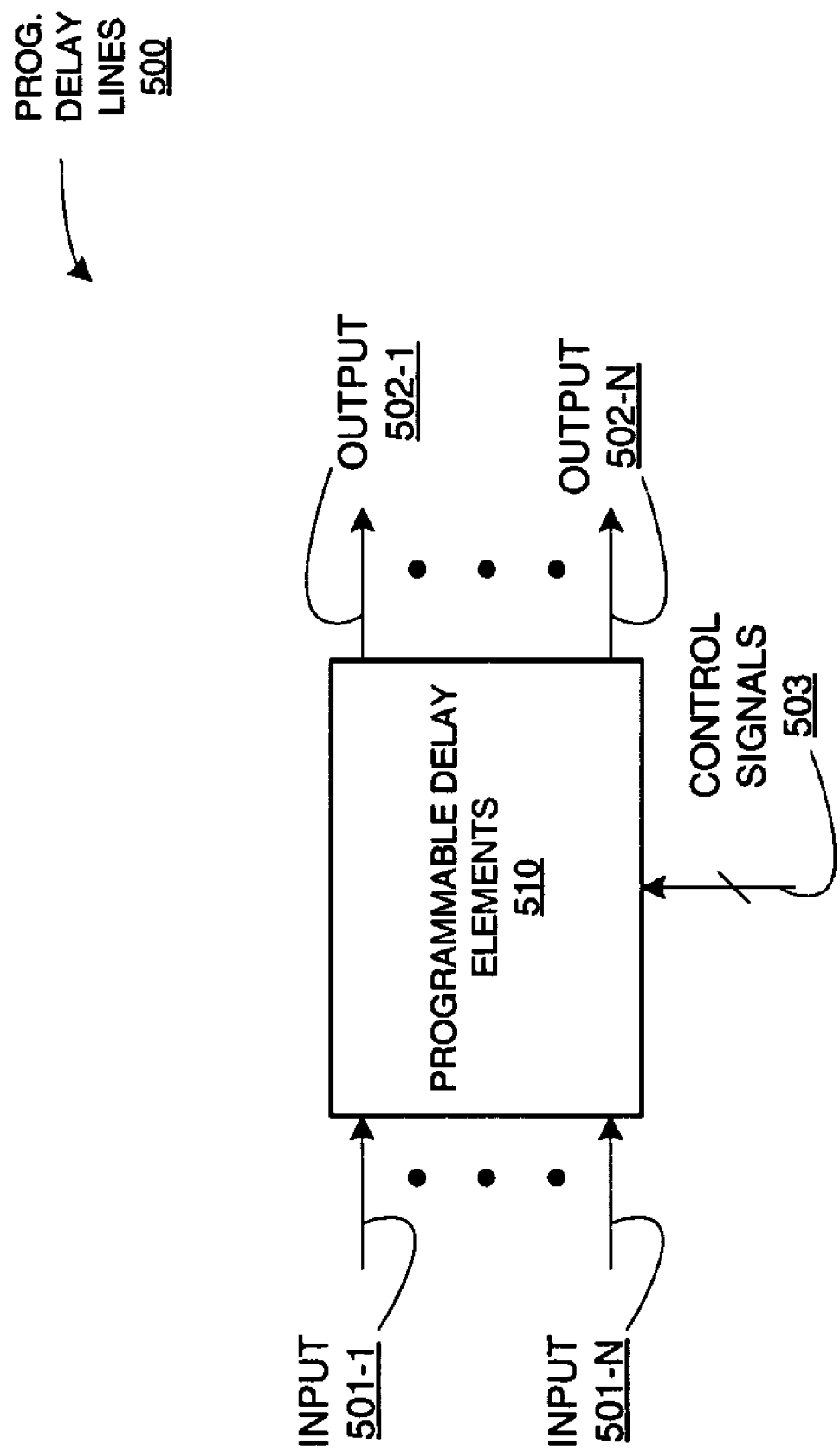
FIG. 5 is a block diagram depicting an exemplary embodiment of programmable delay lines.

FIG. 5 is a block diagram depicting an exemplary embodiment of programmable delay lines 500. Programmable delay elements 510 are configured in N programmable delay lines, for N a positive integer. Thus input 501-1 and output 502-1 are respective signals for one programmable delay line employing a portion of programmable delay elements 510, and input 501-N and input 502-N are for another programmable delay line of programmable delay lines 500 employing another portion of programmable delay elements 510. Respective sets of control signals 503 may be provided for each delay line of programmable delay lines 500, for example to set the number of taps. Examples of such control signals may be a signal to activate clocking, a clock signal, a reset signal, and an increment or decrement signal to increase or decrease the number of taps. As programmable delay lines 500 are known, they are not described in unnecessary detail. In an FPGA, known examples of circuit blocks having multiple programmable delay lines which may be coupled in series to form a signal delay line include digital phase monitors ("DPMs") and digital delay-locked loops ("DLLs").

Returning to FIG. 4, it should be appreciated that though a single programmable delay line 404 is illustratively shown for test circuit 400, multiple test circuits 400 may be used to obtain characterization across multiple programmable delay lines, such as programmable delay lines 500 of FIG. 5. So, though the following description describes how to measure delay and skew of a programmable delay line and how to determine whether delay increases or decreases monotonically for a programmable delay line, it should be appreciated that the following description is applicable to a single delay line, a series or chain of delay lines, and cross-correlation of multiple programmable delay lines in parallel. Thus, for the above-identified embedded or hardwired circuit blocks having more than one programmable delay line and thus more than one associated phase-matched path, skew between paths may be measured, for example. Moreover, it should be understood that both rising and falling edge delay around ring oscillator 300 of FIG. 3 may be determined for different delay settings, and accordingly average skew and delay of discrete delay elements used to provide a delay line may be determined. Furthermore, it should be appreciated that monotonicity among programmable delay lines may be determined for equivalence, or more particularly to determine if different adjustments may be made among programmable delay lines to provide equivalent delays for phase matched paths.

Notably, there may be multiple settings for a programmable delay line. For example, in addition to the number of taps being set, a finer granularity regarding the number of trims between taps may be set. Moreover, there may be still a finer granularity regarding the number of "tweaks" set between trims. For purposes of clarity, only the setting of taps and trims is described, as it will be apparent that the setting of finer granularities may be employed.

Again, though skew and delay comparisons may be made between programmable delay lines, within an embedded circuit block, FIG. 4 is described for providing measurements for a single programmable delay line 404 for purposes of clarity. Thus, with renewed reference to FIG. 4, test circuit 400 is further described. Moreover, it may be assumed that the single programmable delay line may be of a digital phase monitor ("DPM"), which may be used for sweeping phase as described above.

Primer 401 provides an output which is input to an input port of multiplexer ("MUX") 403. It should be understood that test circuit 400, before being ready to accept input signal 402, may be primed to ensure measurement accuracy. Thus, primer 401 may provide an oscillation signal to multiplexer 403, which is used to prime test circuit 400 prior to receiving input signal 402, for which characterization of a programmable delay line 404 with respect to skew and delay, for example, may be done. A demultiplexer ("DEMUX") 408 is coupled at an output-side of programmable delay line 404. Select signal 420 from counter 405 is used to control output of demultiplexer 408 and of multiplexer 403.

In a priming or training mode, test circuit 400 is configured such that multiplexer 403 passes output of primer 401 to programmable delay line 404. Output of programmable delay line 404 is provided to demultiplexer 408. Output of counter 405, namely select signal 420, is applied as a select signal to each of multiplexer 403 and demultiplexer 408. In a priming mode, select signal 420 causes multiplexer 403 to pass primer 401 output and causes demultiplexer to select an output to counter 405 to pass output of programmable delay line 404 thereto. Control signals 407 for a DCM in an FPGA may include a control mode signal, a control go signal, a control select one signal, a control select two signal, and a control oscillator signal, which may be a multiple-bit signal, as is known. Notably, these example control signals are particular to a DLL of a particular FPGA configuration, and other control signals may be used depending on how the DLL is implemented. For example, a control select one signal is to select one delay line and a control select two signal is to select another delay line thereby increasing the length of the total delay line of a DLL. A control oscillator signal is provided to set the number of taps and trims of a programmable delay line. A control mode signal is to put the DLL in a test mode or a user mode. For operation of test circuit 400, the DLL having programmable delay line 404 is put in a test mode. Additionally, a control go signal may be provided to an instruction register of the DLL to strobe in an instruction, such as from a control oscillator to set the number of taps or trims. Thus, control signals may be used to increase or decrease the amount of delay of a programmable delay line 404.

Programmable delay line 404 may in an exemplary embodiment be a chain of delay buffers. Such a chain would be a non-inverting chain, and thus a rising edge at an input end would provide an associated rising edge, though delayed, at an output end. Conversely, a falling edge at an input end of such a programmable delay line 404 would provide an associated delayed falling edge at an output end of programmable delay line 404.

The delayed output in the priming mode of programmable delay line 404 may be counted by counter 405, where counter 405 counts to a threshold number, namely a threshold number of cycles in the priming mode. Of course, the rate at which test circuit 400 cycles will be determined by the frequency of operation, which will vary from application to application. Prior to reaching the threshold number, counter 405 receives output from programmable delay line 404 via demultiplexer 408 responsive to select signal 420. Once counter 405 has passed the threshold count in the priming mode, select signal 420 deselects primer 401 output and selects input signal 402 to pass through multiplexer 403 to programmable delay line 404. Once output signal 420 of counter 405 causes multiplexer 403 to select input signal 402 for output to programmable delay line 404, the priming mode of a test mode ends and a delay line characterization mode of a test mode begins. With this switch from a priming mode to a delay line characterization mode, demultiplexer 408 also switches selection responsive to select signal 420, and allows output from programmable delay line to pass through demultiplexer 408 to provide output signal 410. Demultiplexer 408 is coupled to provide output signal 410 to clock counter 406. This change in selected output from demultiplexer 408 prevents counter 405 from being clocked during the delay line characterization mode.

For the delay line characterization mode, counter 406, which is coupled to receive output signal 410 from programmable delay line 404, is employed. Counter 406 is to control tap or trim settings, namely to increment or decrement taps or trims. Thus, in the example of a DLL in a DCM of FPGA 100 of FIG. 1, counter 406 may be used to provide a control adjustment signal, which may be strobed in responsive to a control go signal of control signals 407 for adjusting delay of programmable delay line 404.

Counter 406 may be configured to provide a divide-by operation, where counter 406 could be synchronous to operation of programmable delay line 404. However, it should be understood that counter 406 need not be synchronous to operation of programmable delay line 404 but may be asynchronous thereto. A minimum divide-by, such as for example approximately four, may be a threshold, depending on the granularity of settings for programmable delay line 404. However, counter 406 may be configured to divide by a number greater than the minimum number of delay elements to be changed. The minimum number of delay elements to be changed will depend of course on how much delay each element provides and the extent to which a time delay associated therewith may be resolved. For example, test circuit 400 may not be able to reliably resolve a one picosecond difference. Thus if each delay element provides a one picosecond delay, counter 406 may be configured to increment or decrement four delay elements at a time to provide a four picosecond delay which may be detected by test circuit 400.

To better understand application of ring oscillator 300, an example of characterization of a programmable delay line is provided below. Though a single delay line is characterized, it will be appreciated by those of ordinary skill that more than one delay line may be characterized, such as with respect to delay, skew, and cross-correlation thereof, as well as the addition of one or more other delay lines coupled in series to the programmable delay line being characterized. To address both rising and falling edge dominant signals, test circuit 400 may be configured to measure rising edge characteristics in one instance and in another instance test circuit may be configured to measure for falling edge characteristics. Notably, as programmable delay line may be a non-inverting configuration, for input signal 402 a rising edge dominant signal, rising edge characteristics may be measured, and for input signal 402 a falling edge dominant signal, falling edge characteristics may be measured. A sequence of delay measurements may be used for determining average per-tap skew, namely the ratio of rising edge propagation delay to falling edge propagation delay of a single tap.

Figure 6:
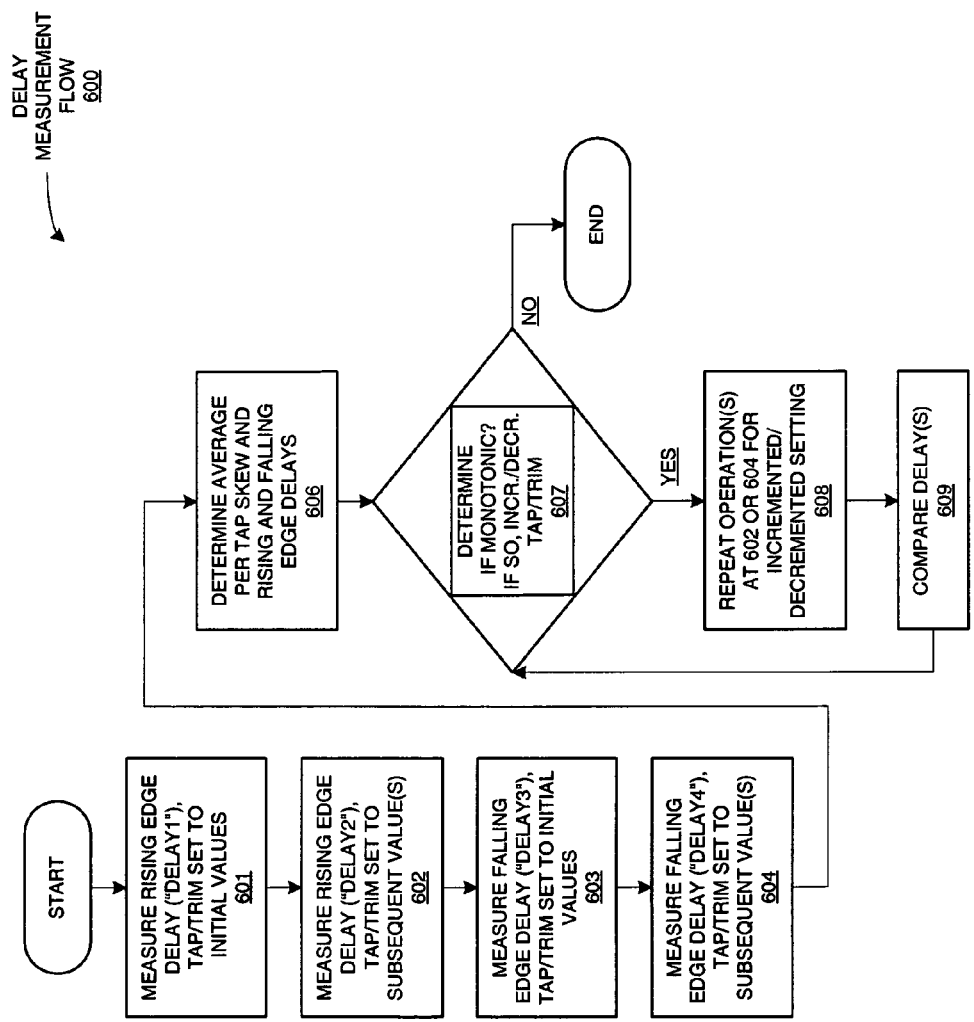
FIG. 6 is a flow diagram depicting an exemplary embodiment of a delay measurement flow for determining average per-tap skew.

Referring to FIG. 6, there is shown a flow diagram depicting an exemplary embodiment of a delay measurement flow 600 for determining average per-tap skew. At 601, rising edge delay is measured, for example, with tap and trim settings both being equal to zero. At 602, rising edge delay is measured again, though with a tap setting set to a value other than zero and with a trim setting set to zero. Examples of such tap and trim settings at 602 may be a maximum tap value or a sufficient number of taps to obtain a reliable average.

At 603, falling edge delay is measured with tap and trim settings both being equal to zero. At 604, falling edge delay is measured with tap settings being set to the same number as set at 602 and with trim set to zero. At 605, measurements obtained at 601 and 603 are used as a baseline against which measurements obtained at 602 and 604 are respectively compared. This is because a ring oscillator, such as ring oscillator 300 of FIG. 3, intrinsically has some delay, which may be subtracted before any tap/trim calculations are made. Delay1 obtained at 601 provides the intrinsic delay around the ring oscillator for a rising edge instance. Delay2 obtained at 602 provides the intrinsic delay around the ring oscillator for a falling edge instance. These measurements are used to more accurately calculate average per-tap skew.

At 606, one or more calculations may be done to characterize aspects of a programmable delay line. For example, average per-tap skew may be determined as set forth below in Equation 1 where: delay1 is obtained from the measurement done at 601, delay2 is obtained from the measurement done at 602, delay3 is obtained from the measurement done at 603, and delay4 is obtained from measurement done at 604, and the number of taps used is the number of taps set either at 602 or 604, as they are the same number.

$$\text{Average per-tap skew} = \frac{|(\text{delay2} - \text{delay1}) - (\text{delay4} - \text{delay3})|}{\text{\# of taps used}} \quad (1)$$

Another calculation which may be done at 606 is the average per-tap delay for a rising edge, which may be determined as set forth below in Equation 2.

$$\text{Average per-tap delay(rise)} = \frac{(\text{delay2} - \text{delay1})}{\text{\# of taps used}} \quad (2)$$

Another calculation which may be done at 606 is for an average per-tap delay for a falling edge, which may be determined as set forth below in Equation 3.

$$\text{Average per-tap delay(fall)} = \frac{(\text{delay4} - \text{delay3})}{\text{\# of taps used}} \quad (3)$$

At 607, a decision as to whether to determine where a programmable delay line is monotonic may be made. Monotonicity may be determined by measuring delay around a propagation path, namely the ring of ring oscillator 300, for an increment or decrement of either one or more taps or one or more trims, or both. If monotonicity is to be determined, then at 607 an increment or decrement of either one or more taps or one or more trims, or both is made. After such increment or decrement, one or both of operations at 602 and 604 may be repeated at 608, depending on whether monotonicity to be determined is of one or both rising and falling edges, where such repetition is with the incremented/decremented setting from 607. Monotonicity for one or both of rising and falling edge delay may be determined at 609 by comparison with one or both of rising edge delay or falling edge delay previously obtained. Thus, for example, one or more taps or trims may be incremented, and using the above measurements, it may be determined whether delay has increased in accordance with the direction of increase of the one or more taps or trims. Similarly, one or more taps or trims may be decremented to determine if delay has decreased in accordance with the direction of the one or more taps or trims decremented. Monotonicity for another increment/decrement may be subsequently done by returning to 607 from 609.

It should be appreciated that data collection is facilitated by transforming the process of skew measurement, namely by observing duty cycle output of a programmable delay line, to a process of delay measurement. Thus, for example, with respect to an FPGA, an IOB programmable delay line, a DLL programmable delay line, a digital frequency shifter programmable delay line, and a DPM programmable delay line may each be characterized. Moreover, for example, with reference to an FPGA, programmable delay lines of a digital phase shifter ("DPS")) and a digital frequency monitor ("DFM") may be characterized. Of course other delay lines may be characterized, including phase path matching for multiple parallel delay lines, whether they exist in an FPGA or other integrated circuit. Furthermore, data collection may be facilitated by making use of precise ATE. Additionally, DFS delay lines may be characterized with a modified control instruction interface where the DFS set of control inputs are phase-shift enable, phase shift increment/decrement, and phase shift clock.

Figure 7:
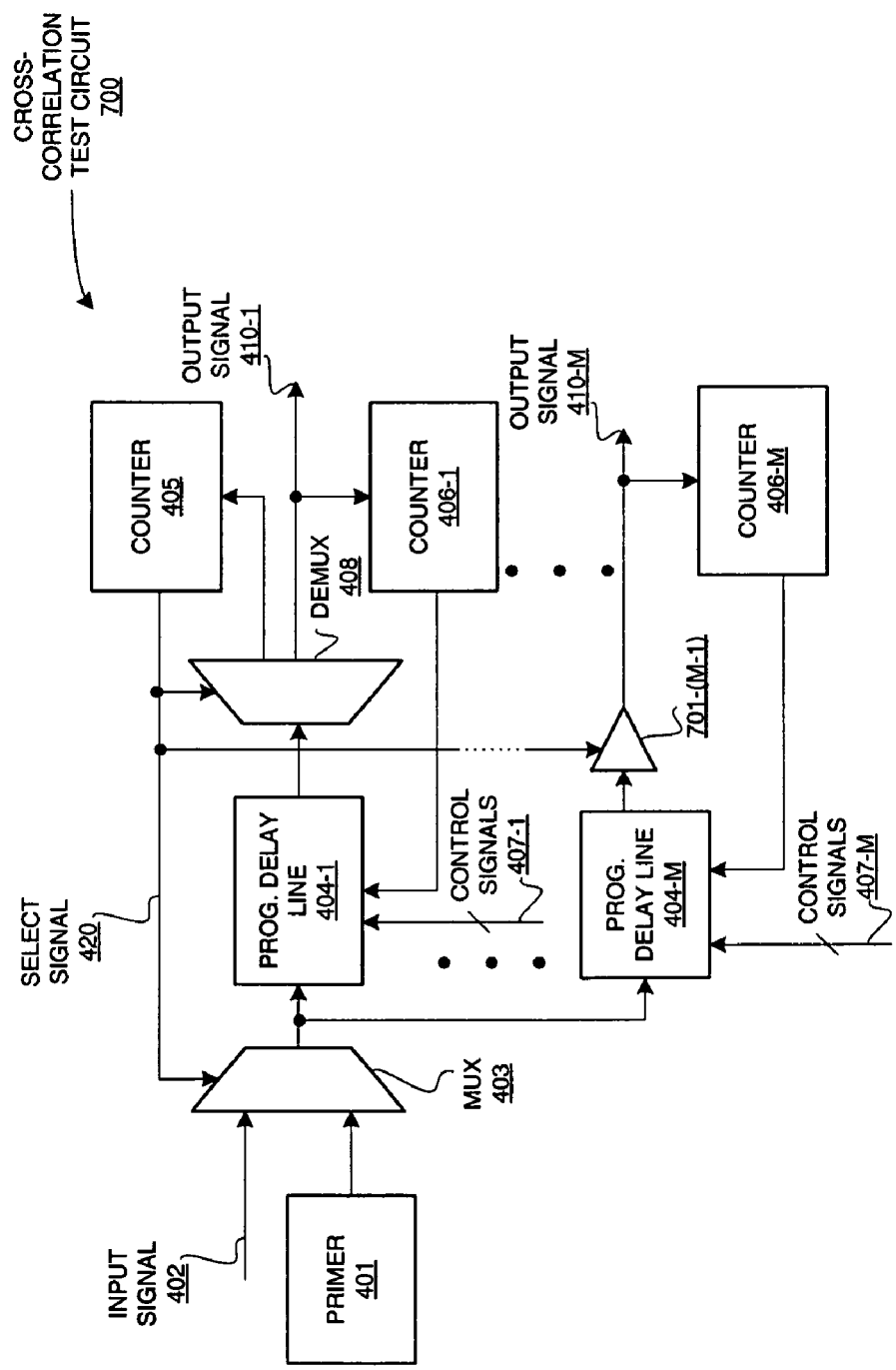
FIG. 7 is a block diagram depicting an exemplary embodiment of a cross-correlation test circuit.

FIG. 7 is a block diagram depicting an exemplary embodiment of a cross-correlation test circuit. Test circuit 700 has common input select circuitry for input to programmable delay lines 404-1 through 404-M, for M a positive integer. Input signal 402 and output of primer 401 are provided to multiplexer 403 as previously described. Output of multiplexer 403 is provided to programmable delay lines 404-1 through 404-M. Each of programmable delay lines 404-1 through 404-M receives a respective set of control signals 407-1 through 407-M for independently adjusting/controlling programmable delay lines 404-1 through 404-M.

Output of a programmable delay line, such as programmable delay line 404-1, is provided to demultiplexer 408 as previously described, which prior description is not repeated here. Select signal 420 is provided to tri-stateable buffers, such as tri-stateable buffer 701-(M–1), coupled to receive outputs from programmable delay lines of programmable delay lines 404-1 through 404-M except for programmable delay line 404-1. In a training mode, tri-stateable buffer 701-(M–1) is tristated such that it does not pass output from programmable delay line 404-M as output signal 410-M. For a programmable delay line cross-correlation mode, select signal 420 is de-asserted, and thus for example programmable delay line 404-M has its output passed through tri-stateable buffer 701-(M–1). Each tri-stateable buffer, such as tri-stateable buffer 701-(M–1), should have at least approximately the same delay as demultiplexer 408.

In a cross-correlation mode, output from programmable delay lines 404-1 through 404-M is respectively provided to counters 406-1 through 406-M and respectively output as output signals 410-1 through 410-M for cross-correlation. Output of counters 406-1 through 406-M is respectively provided to programmable delay lines 404-1 through 404-M. Output signals 401-1 through 410-M may be cross-correlated by an ATE coupled to an integrated circuit, such as an FPGA, having cross-correlation test circuit 700, or may be cross-correlated internal to such an integrated circuit. For an FPGA implementation, other than programmable delay lines 404-1 through 404-M, all other circuitry of cross-correlation test circuit 700 may be instantiated in configurable logic where programmable interconnects are employed to couple in programmable delay lines 404-1 through 404-M.

FIG. 8 is a block diagram depicting an exemplary embodiment of a cross-correlation test system 800. A test activation signal 810 may be provided to ring oscillator 300-1 through 300-M, for M a positive integer greater than one, where such test activation signal 810 is provided from ATE 802. Ring oscillators 300-1 through 300-M may be instantiated in configurable logic of FPGA 100, exclusive of associated test circuits 400-1 through 400-M which are dedicated logic. To measure skew across multiple programmable delay lines, each ring oscillator will have a different programmable delay line within a test circuit thereof. For example, ring oscillator 300-1 includes test circuit 400-1, and test circuit 400-1 includes programmable delay line 404-1. Ring oscillator 300-M includes test circuit 400-M, and test circuit 400-M includes programmable delay line 404-M. Notably, such programmable delay lines 800-1 through 800-M may be provided with separate sets of control signals for separately adjusting either or both taps or trims thereof. Test circuits 400-1 through 400-M may or may not share common priming circuitry, as described with reference to FIG. 7, as they may be independent of one another, namely each being as described with reference to FIG. 4. Output signals 410-1 through 410-M may be provided back to ATE 802 for cross-correlation. Alternatively, an embedded processor in an FPGA, along with cross-correlation software may be used for internal cross-correlation. Cross-correlation may be used to adjust programmable delay lines 404-1 through 404-M to behave at least approximately similarly.

Having programmable delay lines cross-correlated may be limited to programmable delay lines within a same block, such as for example a DFS and DPM, among other known blocks within an FPGA having multiple programmable delay lines operable in parallel. Moreover, cross-correlation may be done for phase matching paths across different blocks, where each block includes a programmable delay line, such as across different IOBs, among other blocks where each includes a programmable delay line.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit for cross-correlation testing, comprising:
    a first ring oscillator and a second ring oscillator, the first ring oscillator including a first test circuit, the second ring oscillator including a second test circuit, the first test circuit coupled via first programmable interconnects to first ring oscillator circuitry, the second test circuit coupled via second programmable interconnects to second ring oscillator circuitry, the first test circuit including a first programmable delay line, the second test circuit including a second programmable delay line, and the first test circuit and the second test circuit configured to provide separately controllable outputs for cross-correlation between the first programmable delay line and the second programmable delay line; and
    the cross-correlation being for at least one parameter selected from a group consisting of delay and skew.

2. The integrated circuit according to claim 1, wherein the first programmable delay line and the second programmable delay line are each dedicated circuitry of a programmable logic device.

3. The integrated circuit according to claim 2, wherein the first ring oscillator circuitry and the second ring oscillator circuitry are each provided from programmably configurable circuitry.

4. The integrated circuit according to claim 3, wherein the first programmable delay line and the second programmable delay line respectively provide a first programmably delayed output and a second programmably delayed output, the first programmably delayed output being provided as a sequential element input signal, the sequential element input signal being provided to a sequential element of the first ring oscillator, the second programmably delayed output being provided as another sequential element input signal, the other sequential element input signal being provided to another sequential element of the second ring oscillator.

5. The integrated circuit according to claim 3, wherein the programmable logic device is a Field Programmable Gate Array.

6. The integrated circuit according to claim 1, wherein the first programmable delay line and the second programmable delay line are part of a circuit block.

7. The integrated circuit according to claim 6, wherein the circuit block is selected from a digital phase shifter and a digital frequency monitor.

8. The integrated circuit according to claim 1, wherein the first programmable delay line and the second programmable delay line are part of different circuit blocks.

9. The integrated circuit according to claim 8, wherein the different circuit blocks are respective input/output blocks of a programmable logic device.

10. The integrated circuit according to claim 9, wherein the programmable logic device is a Field Programmable Gate Array.

11. An integrated circuit for cross-correlation testing, comprising:
    a first ring oscillator and a second ring oscillator;
    the first ring oscillator including a first test circuit;
    the second ring oscillator including a second test circuit;
    the first test circuit coupled via first programmable interconnects to first ring oscillator circuitry;
    the second test circuit coupled via second programmable interconnects to second ring oscillator circuitry;
    the first test circuit including a first programmable delay line;
    the second test circuit including a second programmable delay line;
    the first test circuit and the second test circuit configured to provide separately controllable outputs for cross-correlation between the first programmable delay line and the second programmable delay line; and
    the first test circuit including:
        a primer circuit configured to provide an oscillating primer signal output;
        a multiplexing circuit coupled to receive the oscillating primer signal output from the primer circuit and coupled to receive a sequential element output signal of the first ring oscillator, the multiplexing circuit configured to select an output responsive to a select signal;
        the first programmable delay line coupled to receive a selected output from the multiplexing circuit, the selected output selected from the oscillating primer signal output and the sequential element output signal responsive to the select signal, the first programmable delay line coupled to receive first control signals for programmable configuration thereof;
        a demultiplexing circuit coupled to receive a programmably delayed output from the first programmable delay line and coupled to receive the select signal;
        a first counter coupled to receive the programmably delayed output from the first programmable delay line responsive to the select signal applied to the demultiplexing circuit, the programmably delayed output being a delayed version of the selected output;
        a second counter coupled to receive the programmably delayed output from the first programmable delay line responsive to the select signal applied to the demultiplexing circuit;
        the first counter configured to count to a first threshold number to prime the first programmable delay line, the first counter configured to provide the select signal, the select signal changing state responsive to a count of the first counter exceeding the first threshold number; and
        the second counter configured to count to a second threshold number to adjust delay of the first programmable delay line.

12. The integrated circuit according to claim 11, wherein the first counter is coupled to provide the select signal to select the oscillating primer signal output as the selected output responsive to the count of the first counter being less than or equal to the first threshold number.

13. The integrated circuit according to claim 11, wherein the first counter is coupled to provide the select signal to select the sequential element output signal as the selected output responsive to the count of the first counter being greater than the first threshold number.

14. The integrated circuit according to claim 11, wherein the first programmable delay line and the second programmable delay line are each dedicated circuitry of a programmable logic device.

15. The integrated circuit according to claim 14, wherein the first ring oscillator circuitry and the second ring oscillator circuitry are each provided from programmably configurable circuitry.

16. The integrated circuit according to claim 15, wherein the first programmable delay line and the second programmable delay line respectively provide a first programmably delayed output and a second programmably delayed output, the first programmably delayed output being provided as a sequential element input signal, the sequential element input signal being provided to a sequential element of the first ring oscillator, the second programmably delayed output being provided as another sequential element input signal, the other sequential element input signal being provided to another sequential element of the second ring oscillator.

17. The integrated circuit according to claim 11, wherein the first programmable delay line and the second programmable delay line are part of a circuit block.

18. The integrated circuit according to claim 17, wherein the circuit block is selected from a digital phase shifter and a digital frequency monitor.

19. The integrated circuit according to claim 11, wherein the first programmable delay line and the second programmable delay line are part of different circuit blocks.

20. The integrated circuit according to claim 19, wherein the different circuit blocks are respective input/output blocks of a programmable logic device.

* * * * *